United States Patent [19]
Warble et al.

[11] Patent Number: 5,929,776
[45] Date of Patent: Jul. 27, 1999

[54] LOW VOLTAGE TRANSCEIVER

[75] Inventors: Keith Vaclav Warble, Chandler; Ronald Gene Myers, Scottsdale; Dean Lawrence Cook, Mesa, all of Ariz.

[73] Assignee: Motorola, Inc., Schaumburg, Ill.

[21] Appl. No.: 09/046,013

[22] Filed: Mar. 23, 1998

[51] Int. Cl.⁶ ................................................ H04B 1/04
[52] U.S. Cl. .................. 340/825.44; 455/127; 455/38.3; 455/116; 455/571; 455/343; 455/334; 340/311.1; 330/10
[58] Field of Search ........................... 340/825.44, 311.1; 455/334, 343, 116, 127, 95, 38.3, 571; 330/10

[56] References Cited

U.S. PATENT DOCUMENTS 5,590,419  12/1996  Shimo ...................................... 455/127
5,781,067  7/1998   Tota ......................................... 330/10

Primary Examiner—Brian Zimmerman
Assistant Examiner—Yves Dalencourt
Attorney, Agent, or Firm—Bradley J. Botsch

[57] ABSTRACT

An rf transmitter (319) used with a single cell battery (101) includes a voltage boost circuit (211) integral with a class S amplifier (290). An rf signal to be amplified is separated into its envelope (amplitude) and phase components. The phase component is applied to the input of a power amplifier (260). The envelope is applied to a pulse width modulator (275) which is used to modulate the voltage supplied to the power amplifier (260). The pulse width modulator (275) controls electronic switches (285, 286) which are disposed between the single cell battery (101) and the primary of a step up transformer (211). The secondary of the transformer (211) is coupled to supply voltage to the power amplifier (260). In this manner, the class S amplifier is powered directly from the single cell battery, via a the transformer (211), and power consumption is substantially reduced due to the switching operation of the switches (285, 286).

23 Claims, 2 Drawing Sheets

5,929,776

LOW VOLTAGE TRANSCEIVER

FIELD OF THE INVENTION

This invention pertains to communication devices, in general, and to a miniature wireless communication device including a transmitter such as a pager, in particular.

BACKGROUND OF THE INVENTION

Miniaturized wireless products are functionally limited by battery power. The power drain on batteries is typically greatest during times when the product is transmitting signals. For two way pagers and other radio frequency transmitting products it is important that the amount of power consumed is as low as possible. In addition, battery voltage for single cell batteries that are commonly used in such low power devices such as pagers is typically one volt. In the past, low power transceivers have utilized power boost circuits that are used to boost the battery voltage to power the entire device. Such power boost circuits tend to be inefficient with the result that battery consumption is higher than desirable.

It is desirable to provide a low voltage transceiver with high battery efficiency for use in miniature wireless products.

BRIEF DESCRIPTION OF THE DRAWINGS

The invention will be better understood from a reading of the following detailed description taken in conjunction with the drawings in which like reference designators identify like elements and in which.

DETAILED DESCRIPTION OF THE DRAWINGS

Operation of transmitters from single battery cells usually requires a converter to increase the transmitter voltage to the levels required by various digital and analog circuits. Step up power conversion circuits operating from a low input voltage are somewhat inefficient and battery life is reduced. In accordance with the invention, the low voltage digital circuits of a two way pager or other device incorporating a transmitter are powered directly from the battery to minimize step up conversions for driving power amplifiers and other analog circuits requiring higher voltage. A low power transmitter in accordance with the invention utilizes an envelope elimination and restoration (EER) amplifier in which the power processing stages operate in a switching mode to maintain high efficiency. In the EER amplifier, the envelope is removed from the radio frequency (rf) signal and amplified by a class S modulator that operates directly from the single cell battery voltage. Voltage step up is provided in the modulator by adding a power transformer at the power switching stage. Operating in a pulse width mode, the output of the class S modulator tracks the input rf envelope, but at a higher power level. In accordance with the invention, operation can be either open or closed loop. The rf signal phase information is carried by the power amplifier stages in a separate channel. The class S modulator output is applied to the phase channel power amplifier stages and the amplifier information is restored. In a transceiver in accordance with the invention the amount of power consumed is reduced thereby making the overall system more efficient. Operation time of the transceiver is extended or a broader range of functions can be provided to the end user for the same operate time.

Figure 1:
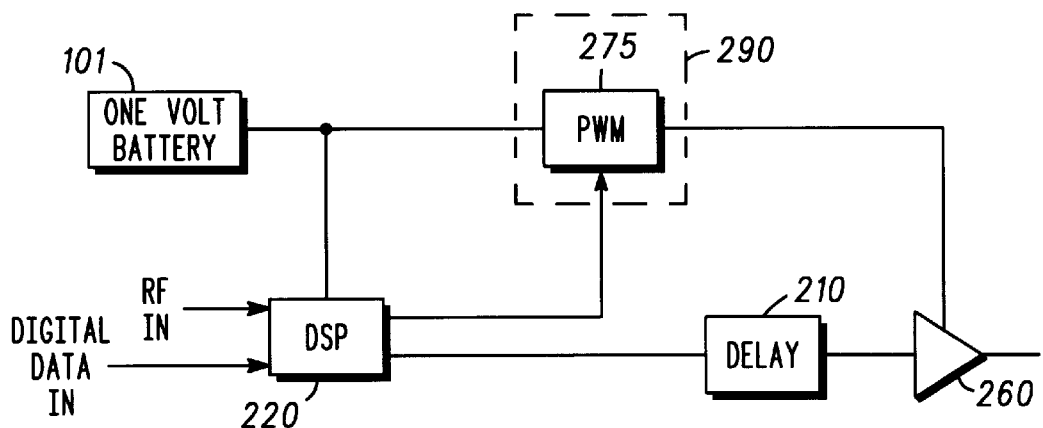
FIG. 1 is a partial block diagram of a transmitter in accordance with the principles of the invention.

FIG. 1 is a partial block diagram of a transmitter in accordance with the principles of the invention. The transmitter uses an amplifier which is an EER amplifier powered from a low voltage source 101 which is a single cell battery of the type used in pagers and the like and which provides a voltage of approximately one volt. The EER amplifier includes a digital signal processor 220 powered directly from the battery 101 that receives a radio frequency (rf) input signal that is to be amplified and provided to an antenna, or a digital data signal that is processed into amplitude and phase components of the rf signal that is to be amplified and provided to an antenna. The digital signal processor 220 is a commercially available product and serves to separate the envelope (amplitude) and phase components of the rf input signal. Although a digital signal processor is shown, it is possible to provide the separation of the rf input signal by using other circuit means such as a diode detection circuit or delay generation that separates the rf signal into a time aligned phase signal and an envelope signal. The phase information of the rf input signal is coupled to a power amplifier 260 via a delay line 210. The amplitude or envelope portion of the rf signal is coupled to a class S amplifier 290 that includes a pulse width modulated amplifier 275 that is coupled to amplifier 260 to pulse width modulate the power supplied to amplifier 260. The output of amplifier 260 is an amplified pulse width modulated rf envelope signal. In accordance with the principles of the invention, the class S amplifier 290 includes voltage boost circuit (shown in FIG. 2) that increases the voltage supplied by battery 101 to provide a higher voltage pulse width modulated power signal to amplifier 260 than would otherwise be provided.

Figure 2:
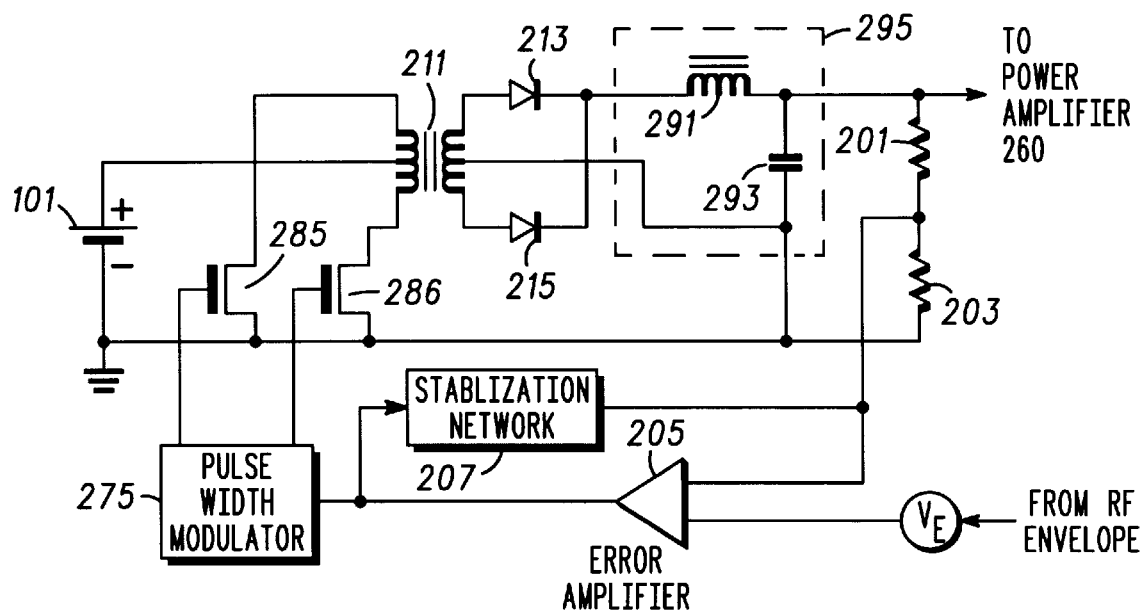
FIG. 2 is a partial/block diagram of the class S modulator used in the transmitter of FIG. 1.

Turning now to FIG. 2, a class S amplifier in accordance with the invention is shown in partial schematic and partial block diagram form. Amplifier 290 receives the rf envelope portion of the rf signal from the digital signal processor 220 as shown in FIG. 1. Amplifier 290 operates as a closed loop system. An error amplifier 205 couples the rf envelope signal to a pulse width modulator circuit 275. Pulse width modulator 275 may be a pulse width modulator circuit of conventional design. The output of pulse width modulator 275 is coupled to an electronic switch comprising transistor switches 285, 286. Transistors 285, 286 are used to switch voltage applied to high frequency transformer 211. Transformer 211 has its primary windings coupled to battery 101. Transformer 211 has a center tapped primary with the center tap coupled to battery 101 and the ends of the winding are coupled to transistor switches 285, 286. The center tapped secondary is coupled to a filter 295 via rectifying means or diodes 213, 215. Filter 295 is a low pass filter comprising inductor 291 and capacitor 293. The transformer steps up the voltage of battery 101 to the level necessary to operate the power amplifier 260. Sense resistors 201, 203 are coupled across the output of filter 295 and provide a feedback path to error amplifier 205. Sense resistors 201, 203 sense the magnitude of the output signal to the power amplifier 260 and provide this sensed signal to an input of error amplifier 205 whereby this sensed signal is compared to the input signal from the RF envelope. An error signal is provided to the pulse width modulator 275. A stabilization network 207 is coupled from the output of error amplifier 205 back to the input coupled to the sensing resistors 201, 203.

In operation, pulse width modulator 275 and amplifier 205 are powered directly from the battery 101 and operate at the battery voltage. Transistor switches 285, 286 chop the dc level from battery 101 and transformer 211 increases the voltage by the turns ratio factor, k. Filter 295 smoothes the transformer output as rectified by diodes 213, 215 to restore the envelope signal at the output of pulse width modulator 290. Sense resistors 201, 203 feed back an envelope signal to the error amplifier that adjusts the operation of the pulse width modulator 275 to control the output voltage to power amplifier 260.

Figure 3:
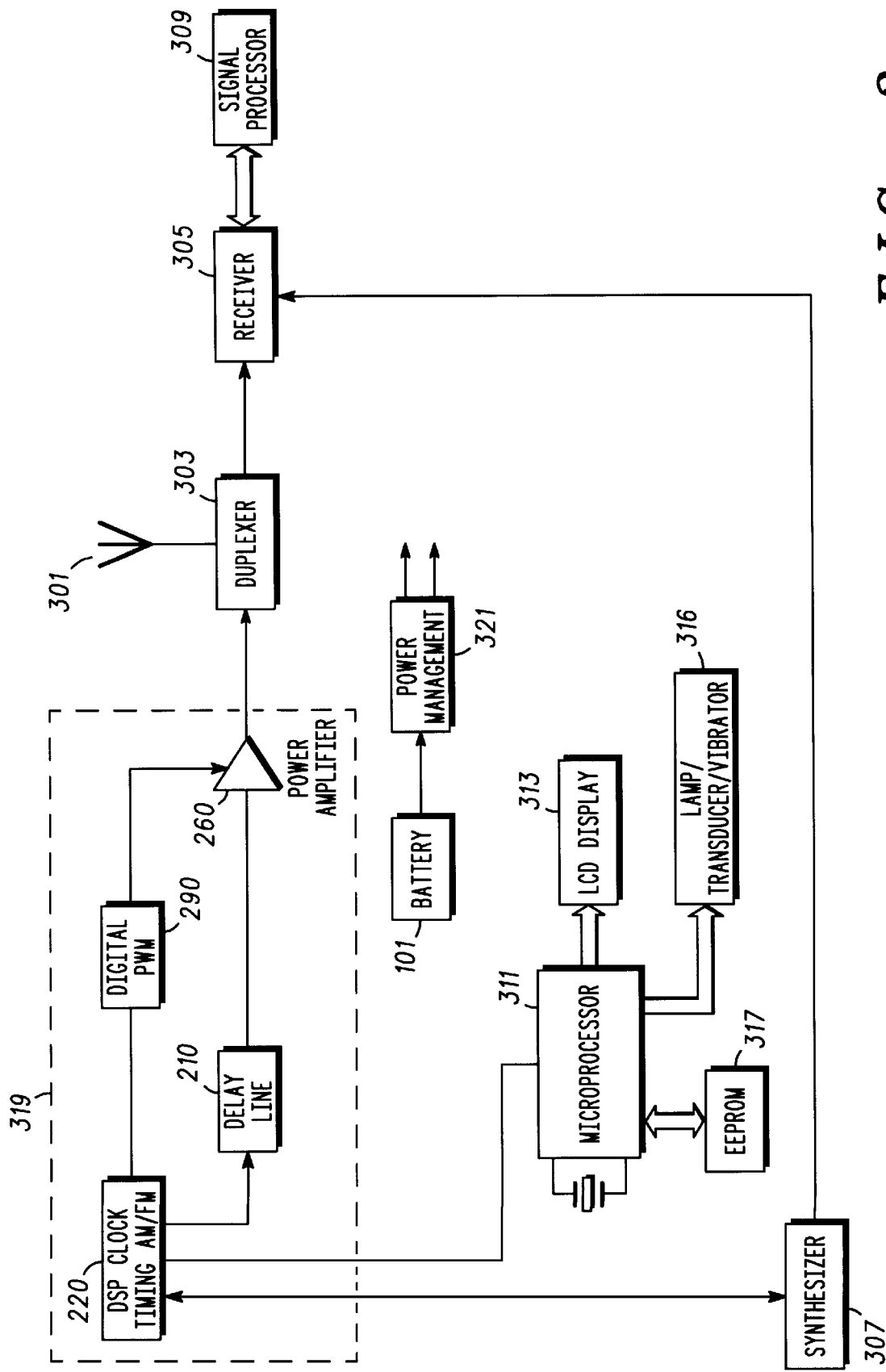
FIG. 3 is a block diagram of a pager in accordance with the principles of the invention.

Turning now to FIG. 3, a low voltage two way pager in accordance with the principles of the invention is shown. The pager includes an antenna 301 that is coupled to a diplexer or transmit-receive switch 303. Diplexer 303 couples the antenna 301 to a receiver 305 and to a transmitter 319. Transmitter 319 and receiver 305 and diplexer 303 form a transceiver. Transmitter 319 is identical to the transmitter shown in FIG. 1 and operates in the same manner. Receiver 305 is coupled to a signal processor 307. A synthesizer 307 provides an rf signal base used by receiver 305 as well as by transmitter 319. The signal processor 307 provides modulation to the signal supplied to transmitter 319. A microcontroller unit (MCU) 311 provides the processor functions for the pager and interfaces to an LCD display 313 as well as to the lamp, transducer and vibrators that are commonly used with pager units and are represented collectively by box 316. A power management circuit 321 is provided. The power management circuit 321 provides power to the various circuits such as transmitter 319 and MCU 311. Power management circuit provides power from the single cell battery 101. Functional operation of the two way pager of FIG. 3 is conventional. In accordance with the invention, the circuitry of the pager exclusive of the transmitter 319 is powered directly from the single cell battery 101 and the pager circuitry exclusive of the transmitter 319 may be referred to a utilization circuitry. Thus, in accordance with the invention, the pager or other transceiver includes utilization circuitry that is directly powered from battery 101 whereas the transmitter includes a power amplifier that includes an integral voltage boost circuit.

Although the invention has been described in terms of illustrative embodiments, it will be understood by those skilled in the art that various changes and modifications may be made to the embodiments without departing from the spirit or scope of the invention. It will be also understood by those skilled in the art that the invention is not limited to the illustrative embodiments and that the invention is not intended to be limited thereto. It is intended that the invention be limited only by the claims appended hereto.

What is claimed is:

1. A low power transmitter comprising:

a single cell battery;

a step up transformer having a primary winding and a secondary winding;

a separation circuit receiving a modulated rf signal and providing an envelope signal and a phase signal;

a pulse width modulator having an input coupled to said separation circuit for receiving said envelope signal and providing pulse width modulated output signals;

an electronic switch having switched outputs and one or more control inputs being responsive to said pulse width modulated output signals, said electronic switch disposed between said battery and said primary winding and operable to switchably connect said primary winding to said battery; and a rf power amplifier having a first input coupled to said phase signal and having a voltage supply input coupled to said secondary winding.

2. A transmitter in accordance with claim 1, comprising:

a filter disposed between said secondary winding and said voltage supply input.

3. A transmitter in accordance with claim 2, comprising:

rectifying means coupled between said secondary winding and said filter.

4. A transmitter in accordance with claim 1, wherein:

said primary winding comprises a center tapped winding having a center tap and first and second ends, said center tap being coupled to said battery, and said first and second ends being coupled to said battery through said electronic switch.

5. A transmitter in accordance with claim 4, wherein:

said electronic switch comprises a first transistor switch having a first switched path coupled between said first end and said battery and a second transistor switch having a second switched path coupled between said second end and said battery.

6. A transmitter in accordance with claim 1, comprising:

one or more sensing devices coupled to said secondary;

an error amplifier coupled to said pulse width modulator input and having a first input for receiving said envelope signal and a second input coupled to sensing devices.

7. A transmitter in accordance with claim 6, comprising:

a filter disposed between said secondary winding and said voltage supply input.

8. A transmitter in accordance with claim 7, comprising:

rectifying means coupled between said secondary winding and said filter.

9. A transmitter in accordance with claim 6, wherein:

said primary winding comprises a center tapped winding having a center tap and first and second ends, said center tap being coupled to said battery, and said first and second ends being coupled to said battery through said electronic switch.

10. A transmitter in accordance with claim 9, wherein:

said electronic switch comprises a first transistor switch having a first switched path coupled between said first end and said battery and a second transistor switch having a second switched path coupled between said second end and said battery.

11. A transceiver comprising:

a singe cell battery;

utilization circuits coupled to and receiving power from said battery, said utilization circuits comprising a receiver;

a transmitter comprising:

a step up transformer having a primary winding and a secondary winding;

a separation circuit receiving a modulated rf signal and providing an envelope signal and a phase signal;

a pulse width modulator having an input coupled to said separation circuit for receiving said envelope signal and providing pulse width modulated output signals:

an electronic switch having one or more control inputs and switched outputs, said electronic switch disposed between said battery and said primary winding and operable to switchably connect said primary winding to said battery; and a rf power amplifier having a first input coupled to said phase signal and having a voltage supply input coupled to said secondary winding.

12. A transceiver in accordance with claim 11, comprising:

a filter disposed between said secondary winding and said voltage supply input.

13. A transceiver in accordance with claim 12, comprising:

rectifying means coupled between said secondary winding and said filter.

14. A transceiver in accordance with claim 11, wherein:

said primary winding comprises a center tapped winding having a center tap and first and second ends, said center tap being coupled to said battery, and said first and second ends being coupled to said battery through said electronic switch.

15. A transceiver in accordance with claim 14, wherein:

said electronic switch comprises a first transistor switch having a first switched path coupled between said first end and said battery and a second transistor switch having a second switched path coupled between said second end and said battery.

16. A transceiver in accordance with claim 11, comprising:

one or more sensing devices coupled to said secondary;

an error amplifier coupled to said pulse width modulator input and having a first input for receiving said envelope signal and a second input coupled to sensing devices.

17. A transceiver in accordance with claim 16, comprising:

a filter disposed between said secondary winding and said voltage supply input.

18. A transceiver in accordance with claim 17, comprising:

rectifying means coupled between said secondary winding and said filter.

19. A transmitter in accordance with claim 16, wherein:

said primary winding comprises a center tapped winding having a center tap and first and second ends, said center tap being coupled to said battery, and said first and second ends being coupled to said battery through said electronic switch.

20. A transceiver in accordance with claim 19, wherein:

said electronic switch comprises a first transistor switch having a first switched path coupled between said first end and said battery and a second transistor switch having a second switched path coupled between said second end and said battery.

21. A method of operating a transceiver comprising a transmitter and utilization circuits from a single cell battery, comprising:

operating said utilization circuits directly from said single cell battery;

separating an rf signal to be transmitted into an envelope signal and a phase signal;

applying said envelope signal to a pulse width modulator to produce a pulse width modulated signal;

utilizing said pulse width modulated signal to control an electronic switch disposed between said single cell battery and a primary winding of a voltage step up transformer to modulate power supplied to said transformer; and supplying power to an rf amplifier from a secondary winding of said transformer, said phase signal being applied to an input of said power amplifier.

22. A method in accordance with claim 21, comprising:

filtering the power supplied from said secondary to said power amplifier.

23. A method in accordance with claim 21, wherein;

said step up transformer steps up the voltage of said battery by a predetermined factor.

* * * * *